US008040651B2

(12) United States Patent
Deml

(10) Patent No.: US 8,040,651 B2
(45) Date of Patent: Oct. 18, 2011

(54) METHOD AND CIRCUIT FOR PROTECTING A MOSFET

(75) Inventor: Christoph Deml, Munich (DE)

(73) Assignee: Infineon Technologies AG, Neubiberg (DE)

( * ) Notice: Subject to any disclaimer, the term of this patent is extended or adjusted under 35 U.S.C. 154(b) by 745 days.

(21) Appl. No.: 12/173,607

(22) Filed: Jul. 15, 2008

(65) Prior Publication Data

US 2010/0014204 A1  Jan. 21, 2010

(51) Int. Cl.
*H02H 9/08* (2006.01)
(52) U.S. Cl. ....................................... 361/93.9
(58) Field of Classification Search ............ 361/93.1, 361/93.9
See application file for complete search history.

(56) References Cited

U.S. PATENT DOCUMENTS

| 5,394,287 | A | | 2/1995 | Sakata et al. |
| 5,808,847 | A | * | 9/1998 | Ferrazzi ................. 361/93.9 |
| 6,097,582 | A | * | 8/2000 | John et al. ................. 361/79 |
| 6,125,024 | A | | 9/2000 | LeComte et al. |
| 6,922,345 | B2 | * | 7/2005 | Nishida et al. ............ 363/21.16 |
| 7,369,386 | B2 | * | 5/2008 | Rasmussen et al. ......... 361/93.9 |
| 2003/0227257 | A1 | * | 12/2003 | Serizawa et al. ............. 315/77 |
| 2010/0014204 | A1 | * | 1/2010 | Deml ......................... 361/93.1 |

FOREIGN PATENT DOCUMENTS

DE  43 10 323 A1  10/1993

OTHER PUBLICATIONS

"4-Channel Serial and Parallel High-Side Pre-FET Driver," TPIC44H01, Sep. 1998, 30 pages, Texas Instruments, Dallas, TX.

* cited by examiner

*Primary Examiner* — Ronald W Leja
(74) *Attorney, Agent, or Firm* — Slater & Matsil, L.L.P.

(57) ABSTRACT

A method and a corresponding circuit protect a power MOSFET from overload when switching the MOSFET off. The current through the MOSFET is compared to a reference signal depending on the time since switching the MOSFET on.

22 Claims, 12 Drawing Sheets

METHOD AND CIRCUIT FOR PROTECTING A MOSFET

TECHNICAL FIELD

The invention relates to the field of electrical circuits comprising transistors. In particular embodiments the invention describes a method and corresponding circuits for protecting MOSFETs employed as switches from overload when switching off a connected inductivity.

BACKGROUND

It is known that transistors can be employed as switches in electrical circuits, wherein the transistor may either be conducting or non-conducting. A transistor, for example, power MOSFETs, thus can be employed as a switch for coupling an electrical load to an electrical energy source.

Upon switching the transistor to its conducting state the electrical load is coupled to the energy source and a current will flow through the transistor to the load. Similarly when switching a transistor off, i.e., switching the transistor from its conducting to its non-conducting state, the electrical load, in particular when comprising an inductor, may discharge its stored energy causing a power peak in the transistor upon switching off. In conventional circuits a transistor simply may be designed to stand the current, i.e., the dimensions of the transistor are chosen such that under normal operating conditions the current will not overload the transistor.

For higher currents a plurality of transistors can be switched in parallel, such that each of the plurality of transistors carries only a part of the total current. Although the current in this case is distributed across the plurality of parallel transistors each of the plurality of transistors is designed for carrying only a portion of the total current. The problem of overload thus remains for each transistor.

However operating conditions may deviate from normal operations, for which the transistor has been designed, and a higher current may flow through a transistor. For example in case of a short on the load side of the transistor an unusual high current may flow causing a current density in the transistor exceeding the allowed range.

A current causing a current density exceeding the allowed range may destroy the transistor by heating the semiconductor structure, such that the transistor is locked in its conducting state and cannot be switched off by applying an appropriate gate voltage. In this case the transistor is destroyed.

Hence a transistor operated as a power switch should be protected from overload operating conditions. In conventional circuits transistors are protected by either increasing the resistance in the circuit, for example, by controlling the gate voltage to increase the resistance of the transistor and thus limiting the current, or by switching the transistor off, in case a sensed current exceeds a predefined maximum.

In conventional circuits the current limit for switching a transistor off is defined to be static for a particular load. Hence there is a need for an improved method and circuit providing a more flexible protection of a transistor.

DETAILED DESCRIPTION OF ILLUSTRATIVE EMBODIMENTS

The present invention will now be described with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In particular functional blocks for processing a signal may be implemented in various conventional designs.

Although the embodiments described herein, in particular, relate to MOSFETs employed as switches the disclosed method and circuitry generally may be applied to circuits comprising any transistor operated as a power switch.

Figures 1A, 1B:
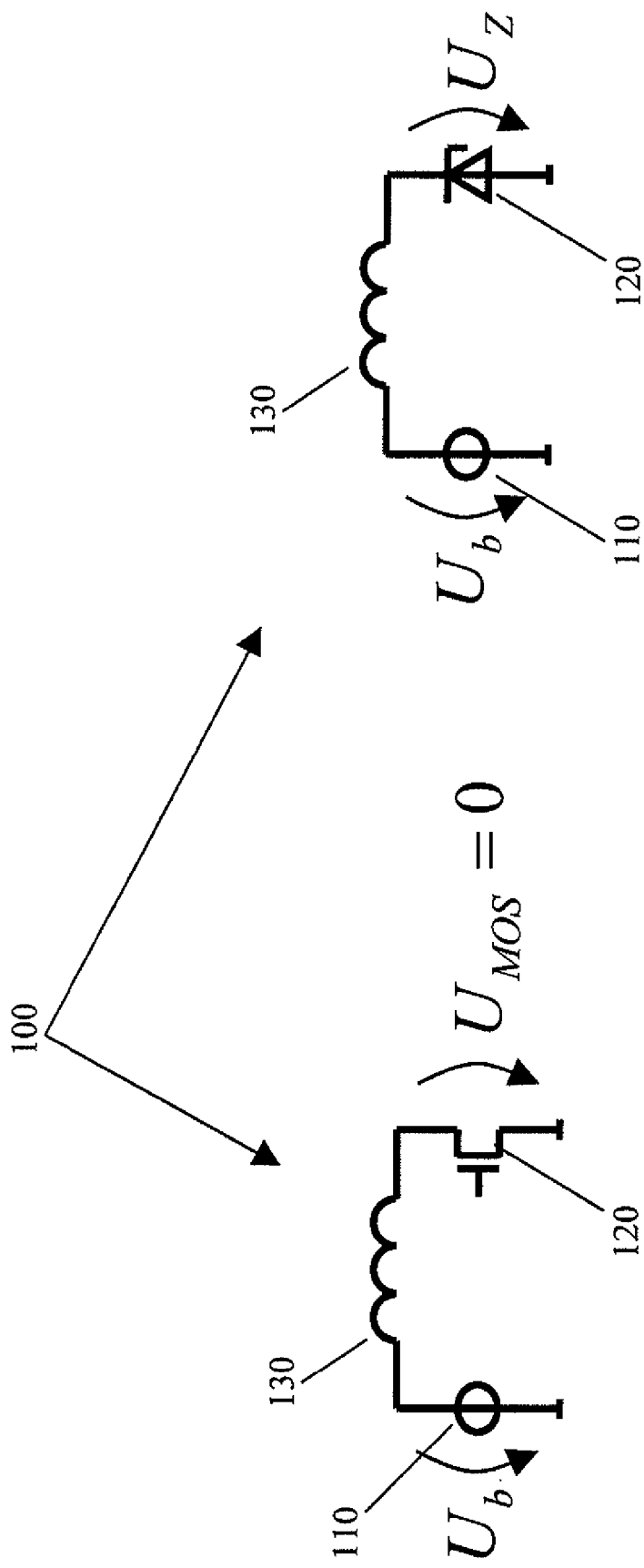
FIGS. 1a and 1b depict circuit diagrams comprising a transistor as a switch and an inductive load in operation.

FIGS. 1a and 1b depict a circuit 100 comprising a voltage source 110, a MOSFET 120 and an inductor 130.

In FIG. 1a power MOSFET 120 is controlled to switch to its conducting state, i.e., in case of an N-MOSFET a high voltage is applied to its gate for switching to conducting. As the switch is assumed to be ideal, that is the switch does not have any resistance, the voltage across MOSFET 120 is assumed to be zero, i.e., $U_{MOS}=0$. Accordingly voltage $U_b$ of voltage source 110 completely drops across inductor 130. Voltage source 110 in one embodiment may be a battery. Once the transistor is switched to conducting a current flows in the circuit and inductor 130 stores energy E as given by:

$$E = \tfrac{1}{2} \cdot L I^2 \text{ with}$$

L being the inductivity of inductor 130, and
I being the current through inductor 130.

When switching MOSFET 120 from it's conducting to its non-conducting state inductor 130 "tries" to keep up the current flow through itself, thus causing a current flowing through the circuit and through MOSFET 120.

FIG. 1b depicts the voltages in circuit 100 with MOSFET 120 being switched off at a time immediately after switching off the transistor, i.e., immediately after applying a zero voltage to its gate. MOSFET 120 in FIG. 1b accordingly is represented by its parasitic Z-diode resulting from the pn-junction within MOSFET 120. Before the MOSFET has been switched off the current through the circuit had reached amplitude greater zero, such that the inductor stores energy.

When switching MOSFET 120 off, i.e., switching to its non-conducting state, the energy in inductance 130 discharges. Due to the nature of the Z-diode in the MOSFET the voltage across Z-diode 120 is nearly constant during the discharge process, approximately above its breakdown voltage and varies due to the heating of the diode, i.e., the heating of the MOSFET, resulting from the absorbed energy and the current density.

The energy stored in inductance 130 discharges into MOSFET 120, wherein the voltage across the MOSFET in the circuit is nearly constant over time. MOSFET 120 thus absorbs the energy stored in inductance 130 and energy from voltage source 110. The energy absorbed in the MOSFET is dissipated into thermal energy. The process of switching the MOSFET off in this way heats MOSFET 120, wherein the MOSFET is destroyed when the pn-junction within the MOSFET exceeds a temperature limit. Heating of the pn-junction in the MOSFET to a temperature exceeding the limit destroys the transistor as the semi conducting material then may become intrinsically conductive, such that the MOSFET cannot be switched off anymore and thus becomes uncontrollable.

That is, starting from the maximum allowed temperature $T_{j,0}$ of, for example, 150° C. and assuming the MOSFET to be destroyed at a temperature of $T_{j,max}$ of, for example, 400° C., then the MOSFET may be heated by the process of switching off by $\Delta T_{max}$ of 250° Celsius. Further heating will destroy the MOSFET.

While a single heating exceeding the maximum temperature of $T_{j,max}$, may destroy the MOSFET, a repetitive heating causes mechanical stress on the MOSFET structure, because the different materials combined in the MOSFET structure have different expansion coefficients. Accordingly the materials will not expand equally thus causing mechanical stress at the borderlines. Although this mechanical stress may also damage the MOSFET upon repetitive temperature cycling this effect usually does not destroy the MOSFET immediately. In particular the heating should be limited such that any mechanical effects are reversible.

When considering the limitation of the energy absorbed by the MOSFET transistor the time in which the energy is absorbed should be considered also. If a certain amount of energy is absorbed in a very short time, then the device, i.e., the MOSFET, will heat up to a higher temperature as compared to a situation in which the same amount of energy is dissipated over a longer time period, which allows the device to divert the thermal energy. In particular the MOSFET as considered here may divert thermal energy to its surrounding, i.e., for example, to its casing. That is the same amount of energy absorbed by the MOSFET will cause a smaller increase of temperature if the energy is absorbed in a longer time period.

Figure 2:
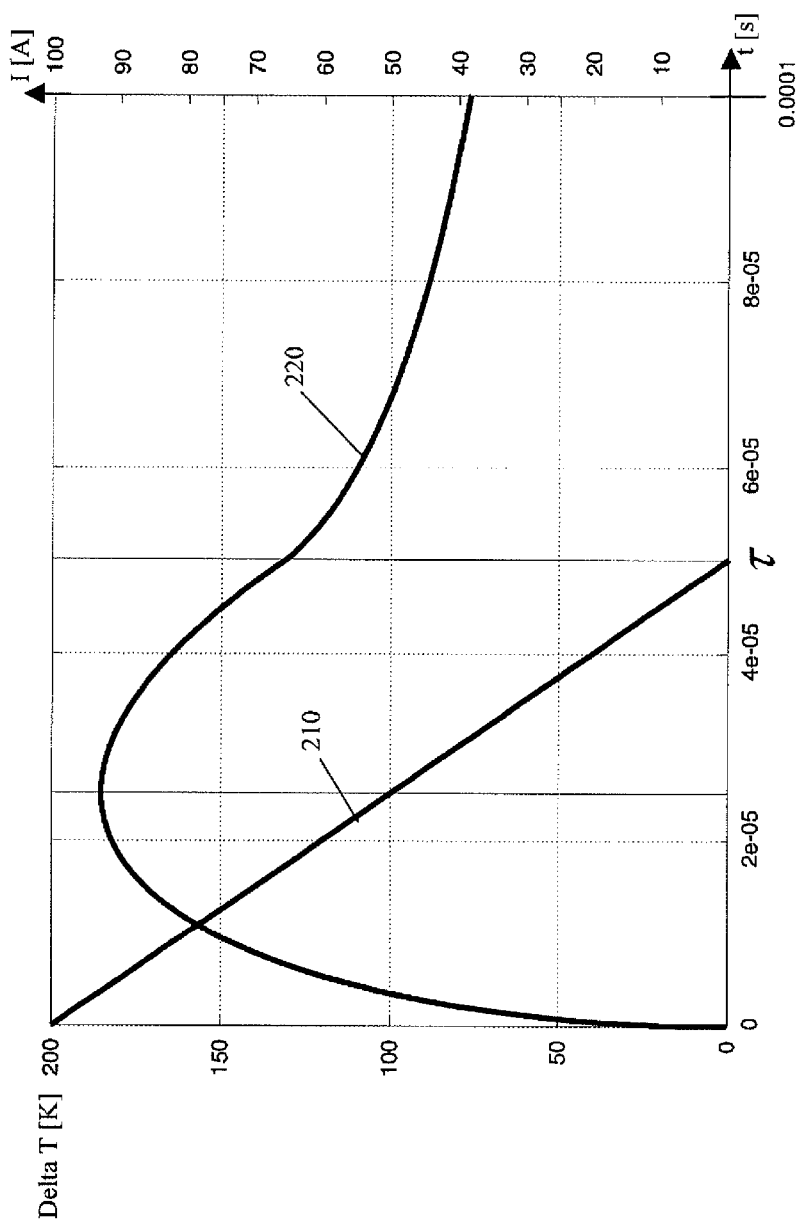
FIG. 2 depicts the current through a transistor and corresponding heating of the transistor.

FIG. 2 depicts a curve 210 illustrating the current through and a curve 220 illustrating the resulting heating of a MOSFET when switching off the MOSFET in a circuit as shown in FIG. 1. Note that in the figure the temperature scale is drawn on the left and the current scale is drawn on the right side of the coordinate system.

For calculating the curves the cross-sectional area of the MOSFET was assumed to have an area of $A=7$ mm², the voltage $U_b$ of the voltage source being $U_b=12V$ and the inductor having an inductance of $L=16.5$ µH, the voltage $U_z$ across the parasitic Z-diode of the MOSFET being $U_z=45V$ and constant.

Current curve 210 shows that the current starts from an initial value of $I_0=200$ A at $t=0$ i.e., at the start of the switch-off process, and decreases with a constant rate to zero at $t=\tau=50$ µs. The additional heating 220 caused by the energy absorbed in the MOSFET starts from 0 Kelvin and increases fast to its peak value $\Delta T_{max}$, then decreases due to heat dissipation within the MOSFET. Note that the peak value of the heating is reached before the current 210 has reached zero.

Starting from the voltage across the inductor, which is given as:

$$U_z - U_b = L \cdot dI/dt \quad (1)$$

with L being the inductance, the time $t=\tau$ can be calculated to be:

$$\tau = L \cdot \frac{I_0}{U_Z - U_b} \quad (2)$$

with $I_0=200$ A being the initial current value at $t=0$.

Starting from a simplified, one-dimensional model for heat dissipation in the MOSFET device, wherein thermal energy is coupled to one end of a semiconductor rod of infinite length, the maximum temperature increase $\Delta T_{max}$ at the one end can be determined to be:

$$\Delta T_{max} = a \frac{U_Z I_0}{A} \sqrt{\tau} \quad (3)$$

with A being the cross-sectional area of the pn-junction in the MOSFET, and a being the dynamic heating coefficient of silicon, wherein a can be further determined to be:

$$a = \frac{2}{\sqrt{\pi c \rho \lambda_{th}}} \cdot \frac{\sqrt{2}}{3} \quad (4)$$

with c being the specific heat capacity of silicon, $\rho$ being the density of silicon, and $\lambda_{th}$ being the specific heat dissipation coefficient of silicon.

By replacing $\tau$ in (3) as determined in (2), we find, $$\Delta T_{max}^2 = \frac{a^2}{A^2} \cdot \frac{U_Z^2}{U_Z - U_b} L I_0^3 \quad (5)$$

Accordingly for a given $\Delta T_{max}$ we find $L \propto I_0^{-3}$, i.e. L is proportional to $I_0^{-3}$.

Figure 3:
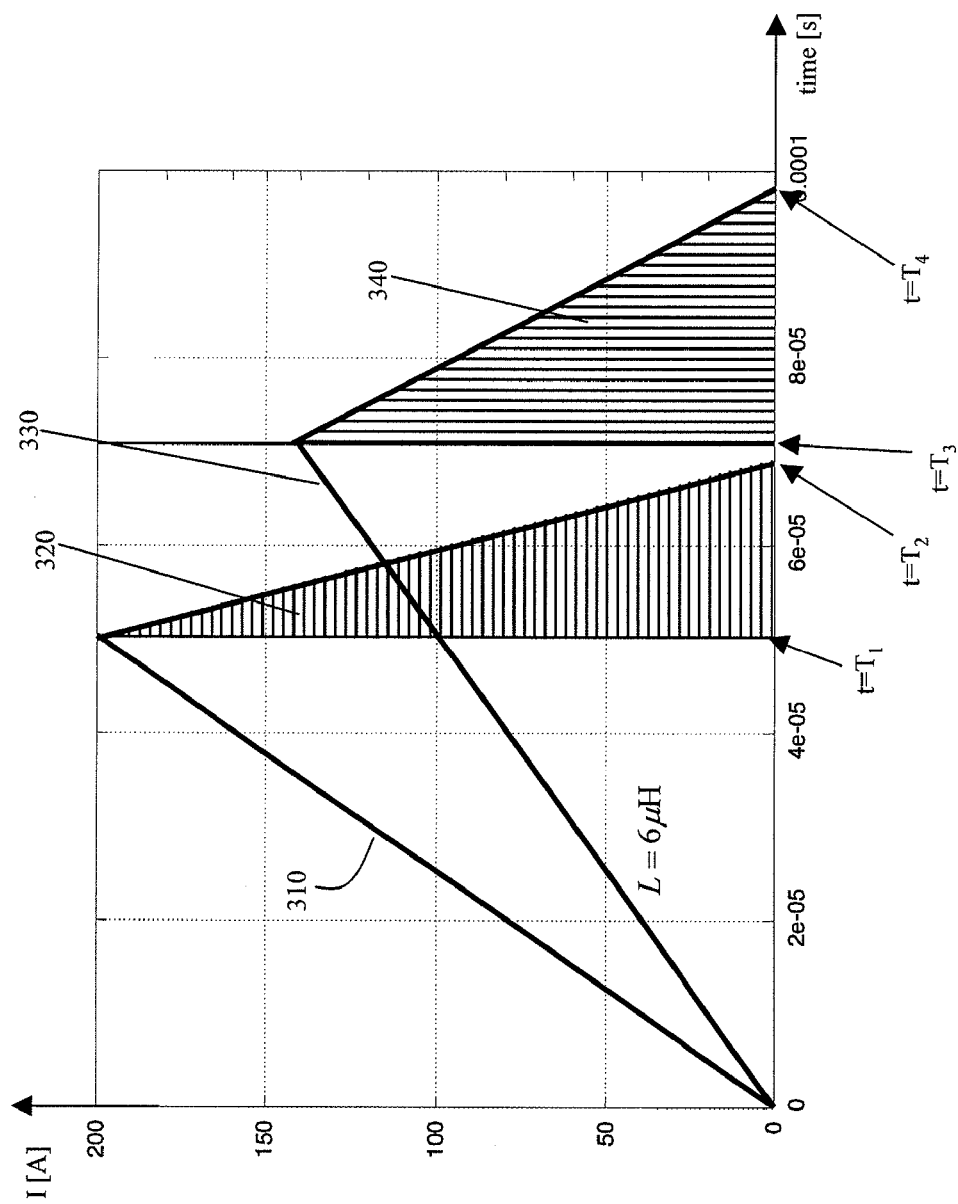
FIG. 3 depicts the correlation of inductance and current when switching power on and off.

Turning now to FIG. 3 the curves illustrate the current flowing through an inductor 130 when switching a circuit as depicted in FIG. 1 on at a time $t=0$, i.e., switching MOSFET 120 to conducting, and switching the circuit off, i.e., switching MOSFET 120 to non-conducting at a later time.

Curve 310 shows the current flow in the circuit wherein inductor 130 in circuit 100 has an inductance of $L=3$ µH. At a time $t=0$ the inductor is coupled to voltage source 110 by switching the MOSFET to conducting. Accordingly a current starts to flow through the circuit, wherein the current increases linearly in time. MOSFET 120 is then switched to non-conducting at time $t=T_1$. The current accordingly decreases linearly in time to zero until $t=T_2$. As the current flows through the MOSFET and causes a voltage of $U_z$, which is assumed to be constant as mentioned above, the energy absorbed within the MOSFET can be calculated as the product of voltage $U_z$ and current I in the time interval from $t=T_1$ to $t=T_2$. Accordingly the energy absorbed in MOSFET 120 is proportional to the size of shaded area 320.

Curve 330 depicts the current profile with inductor 130 having an inductance of $L=6$ µH. Due to the higher inductance the current increases with half the rate. Accordingly at time $t=T_1$ the current value of 330 is half of the value of curve

310. Similarly upon turning MOSFET 120 off at a time t=$T_3$ current 330 also decreases with half the rate.

The point in time for switching off MOSFET 120, t=$T_3$, is chosen such that the energy dissipated by the bigger inductance equals that of the smaller inductance. In the figure this is illustrated in that area 340 is of equal size as area 320. Furthermore the duration of the switch off process, i.e., the time from t=$T_3$ to t=$T_4$, lasts longer than the corresponding time for switching off current 310. Accordingly for absorbing the same energy quantity the inductor of bigger inductance can be switched off at a later time and the switching off process lasts longer. Due to the longer lasting of the switch off process the MOSFET is less heated, as due to the longer duration there is more time for the heat to dissipate from the pn-junction in the MOSFET.

So considering the effect that during the switch-off process the energy absorbed in the MOSFET has more time to dissipate then the inductor of bigger inductance can be switched off even later to effect an equal heating of the MOSFET. This is illustrated in FIG. 4.

Figure 4:
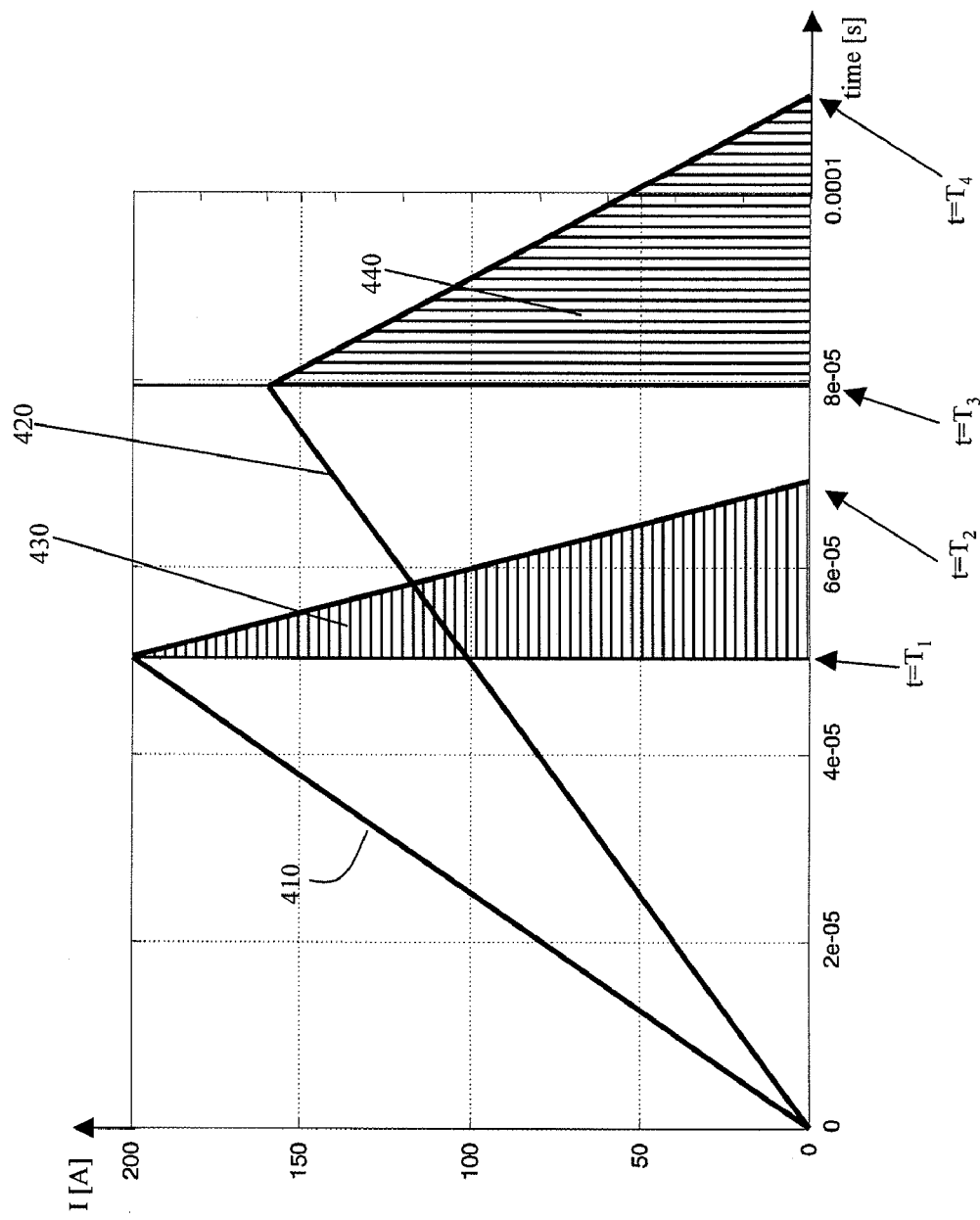
FIG. 4 depicts curves of currents when switching a transistor with an inductive load on and off.

The chart of FIG. 4 depicts curve 410 showing the current profile through an inductor of L=3 µH, which is the same as curve 310 in FIG. 3. Curve 420 shows the current profile through an inductor having an inductance of L=6 µH. Here t=$T_3$ is chosen such that switching off the inductor of smaller inductance affects the same temperature lift as switching off the inductor of bigger inductance. That is due to the heat dissipation during the switch off process the inductor of higher inductance can be switched off significantly later than the inductor of smaller inductance while causing the same heating of the MOSFET. The time t=$T_3$ in FIG. 4 accordingly is later than the corresponding time in FIG. 3.

Furthermore switching off the inductor of higher inductance dissipates more energy into the MOSFET than switching off the inductor of smaller inductance. This is illustrated by the size of area 440, which is proportional to the dissipated energy and exceeds the size of area 430.

Taking into account that the source voltage $U_b$ equals the voltage across inductor 130 while the MOSFET is switched on, we find at the time when switching the MOSFET off $$U_b = L \frac{I_0}{t_E} \quad (6)$$

with $I_0$ being the current when switching, and $t_E$ being the duration of the on-phase.

For eliminating the unknown value of L from equation (5), we can replace L by $$L = U_b \frac{t_E}{I_0}, \quad (7)$$

which results in, $$\Delta T_{max}^2 = \frac{a^2}{A^2} \cdot \frac{U_Z^2}{U_Z - U_b} \cdot \frac{U_b t_E}{I_0} I_0^3. \quad (8)$$

Starting from equation (8) current $I_0$ can be determined to, $$I_0 = \frac{A \cdot \Delta T_{max}}{a \cdot U_Z} \sqrt{\frac{U_Z - U_b}{U_b \cdot t_E}} \Rightarrow I_0 \propto t_E^{-0.5} \text{ and} \quad (9)$$

$$t_E = \frac{\Delta T_{max}^2 A^2}{a^2} \cdot \frac{U_Z - U_b}{U_b \cdot U_Z^2} \cdot \frac{1}{I_0^2} \quad (10)$$

Assuming a predefined allowed maximum heating $\Delta T_{max}$ in MOSFET 120 then the time duration $t_E$ for switching the MOSFET off can be determined according to equation (10) and independently of inductance L in the circuit.

The time for switching MOSFET 120 off safely, i.e., without allowing the MOSFET to absorb energy causing a heating above $\Delta T_{max}$ can be determined by measuring the current flowing through circuit 100 and the time passed since the MOSFET has been switched on. Accordingly the MOSFET can be switched off safely as long as the current flowing through MOSFET 120 is below the maximum value as given by equation (9), wherein the inductance value of the circuit coupled to the MOSFET is of no importance. That is the MOSFET switch does not need to know the inductance value of the coupled inductor in the load circuit.

Figure 5:
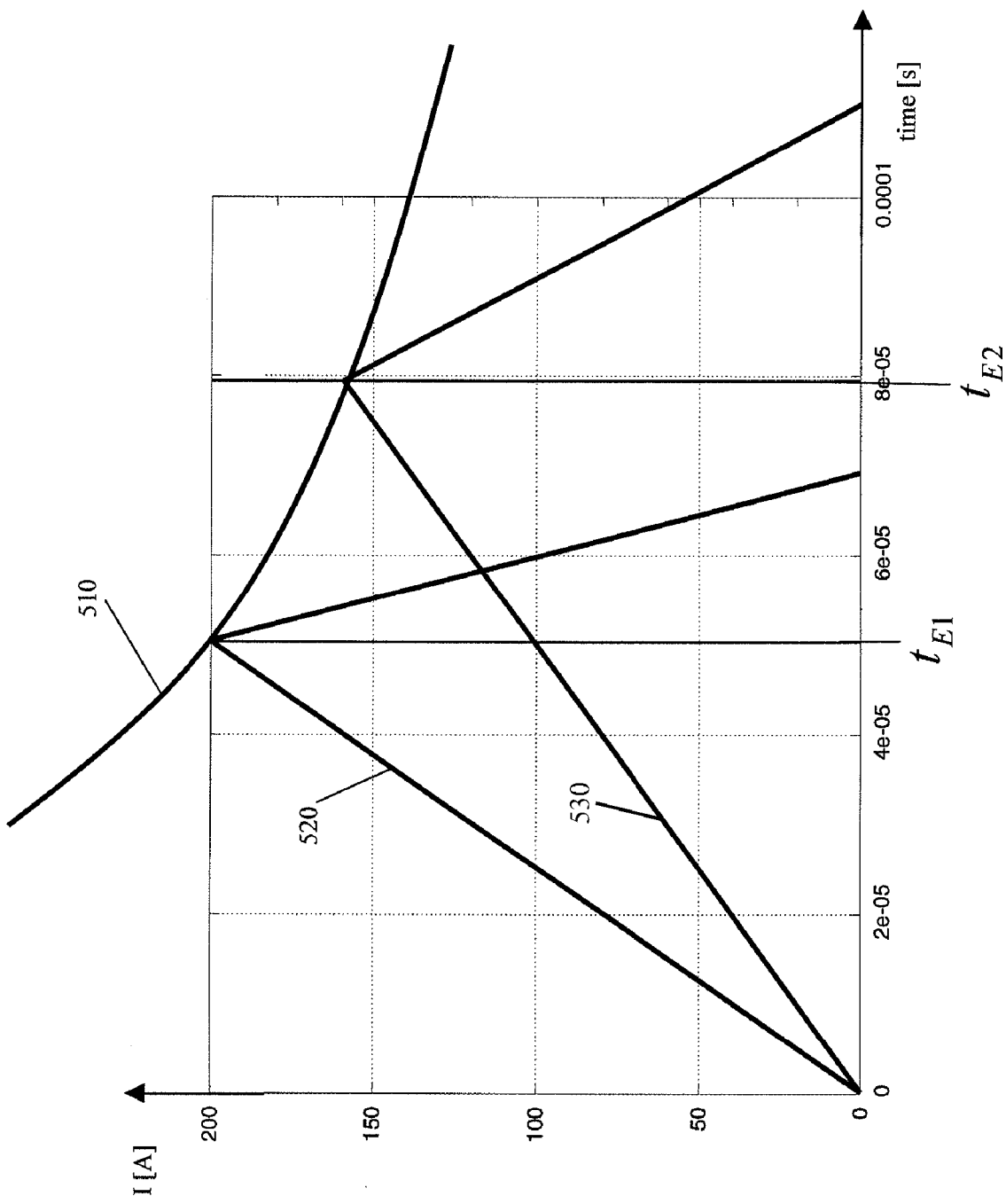
FIG. 5 depicts a current limit and corresponding current curves.

The correlation as given by equation (9) is illustrated in FIG. 5. The correlation between the maximum of current $I_0$ and the time for switching MOSFET 120 off is given by curve 510, wherein according to equation (9) the curve illustrates that the threshold value of current $I_0$ decreases in time and converges to zero. Curve 510 illustrates the threshold value of current $I_0$ for switching the MOSFET off safely.

Curve 520 shows the current profile in the circuit, i.e., through MOSFET 120, in case a small inductance is coupled to the MOSFET. Due to the small inductance value the current will increase fast until it reaches current limit $I_0$ at a time t=$t_{E1}$, such that $t_E$=$t_{E1}$. In case that the inductance value coupled to the MOSFET is of bigger value, then the current increases with a smaller rate as illustrated by curve 530. Accordingly the current reaches the value defined by equation (9) for switching the MOSFET off at a later time, i.e., at t=$t_{E2}$.

In a method for protecting a MOSFET from overload current when switching off a coupled inductor the MOSFET can be protected from overload current by switching the MOSFET off if the current reaches or exceeds a predefined limit, wherein the limit decreases with time and converges to zero, confer equation (9). A circuit employing the method accordingly comprises a suitable means for providing a current limit, wherein the current limit as described above decreases with time, and for comparing the current actually flowing through the MOSFET, or a corresponding signal reflecting the current through the MOSFET, with the provided current limit signal.

A circuit employing the method for determining the time when to switch off will accordingly disconnect its coupled load from the power source. Taking into account that the current limit converges to zero in time the MOSFET will switch off regularly. Thereafter the MOSFET can be switched to its conducting state again as soon as the MOSFET has cooled down from the heating of the switch off process. Accordingly the MOSFET will be switched off after the current limit has been reached and may be switched on again, such that the MOSFET will cycle through switching on and off repeatedly.

Figure 6:
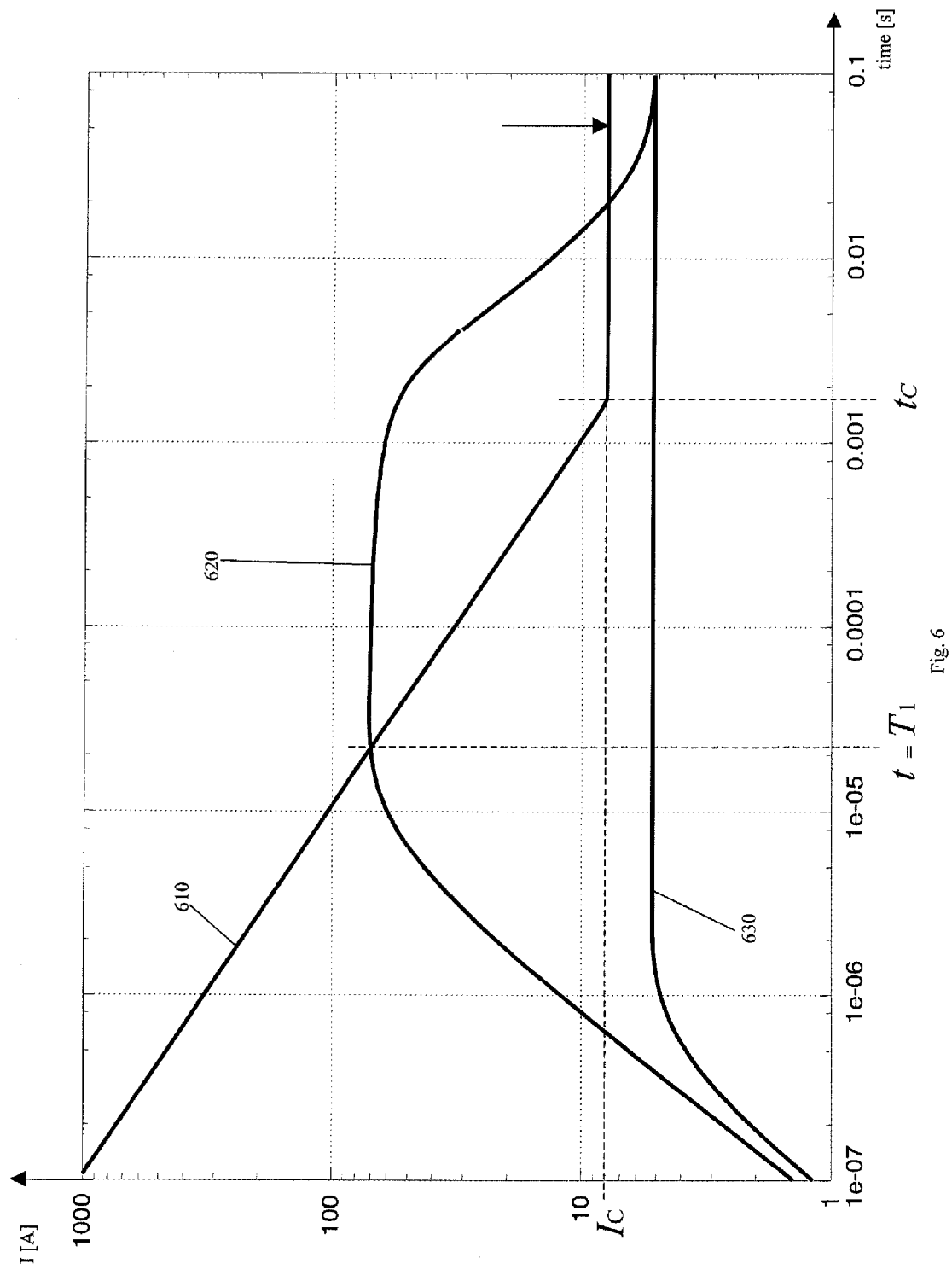
FIG. 6 depicts the temporal development of current limit and current through a transistor in operation.

In order to prevent the current limit from dropping to zero a threshold value can be defined as illustrated in FIG. 6, such that the current limit for switching off the MOSFET does not drop below a predefined minimum value. In one embodiment the minimum value can be defined by considering the biggest inductance in the load circuit. For example, in the automotive industry, i.e., in a vehicle, a maximum inductance of typically 10 mH and thus a current limit of accordingly 8 A is assumed, such that for the current limit a minimum of 8 A is set.

Note that in the chart the current on the y-axis and also the time on the x-axis are plotted logarithmically. Curve 610 showing the current limit of $I_0$ thus is drawn as a falling, straight line until $t=t_C$ and having a constant value of $I_0=I_C$ thereafter. In this embodiment the current limit of $I_0$ was calculated for a temperature rise of 60 Kelvin assuming a junction surface of 7 mm². The MOSFET accordingly will not be switched off in case the current does not exceed a current of $I_0=I_C$, such that the MOSFET will not switch off necessarily and thus will not cycle through a loop of being switched on and off repeatedly.

Curve 620 shows a current profile when switching on an inductor of L=1 µH in series to a cold 55 W light bulb, which is a typical load in automotive applications. As illustrated current 620 increases until it exceeds curve 610 at time $t=T_1$. At that time the MOSFET would be switched off.

Curve 630 depicts a current profile of switching on an inductor of L=1 µH in series to a hot 55 W light bulb. The hot light bulb prevents the current from exceeding above the current limit as indicated by curve 610. Once the process of switching on is settled the bulb draws a constant current. Due to the constant limit for any time $t \geq t_C$ the MOSFET will not switch off at all.

Taking into account that the conditions assumed for calculating the current limit $I_0$ may deviate from real world conditions then the equation for calculating the current limit can be adapted to real world conditions. Deviations from the assumed conditions, for example, may be heat conduction and accordingly a heat dissipation that is not one-dimensional, wherein the heat dissipation in different directions may vary depending on material characteristics. Also heat may be stored differently in the material surrounding the MOSFET, i.e., heat may be stored in metal located close to the MOSFET, which further affects the heat dissipation and thus may cause a deviation from the calculated current limit.

Series of measurements have shown that under consideration of the current profile the maximum inductance of a coupled load, which can be switched off safely, i.e., without destroying the MOSFET, can be approximated to, $$L = 1.4H \cdot \left(\frac{I_0}{A}\right)^{\frac{1}{1-2.4}}, \quad (11)$$

wherein A is the current unit Ampere and H is inductance unit Henry.

By replacing the inductance in above given equation (6), then current limit $I_0$ can be calculated as a function of time $t_E$ as, $$I_0 = \left(\frac{U_b t_E}{1.4H}\right)^{\frac{1}{1-2.4}} \cdot A, \quad (12)$$

again with A for Ampere and H for Henry.

The current limit for switching the MOSFET off thus is a function of time $t_E$ being the time since switching the MOSFET on. That is the current limit for switching the MOSFET off safely can be determined without knowing the inductance in the load circuit.

For employing the proposed method the circuit in one embodiment comprises means for sensing the current flowing through the MOSFET and for providing a signal reflecting current limit in order to compare the sensed current, or a corresponding signal, to the current limit signal. The corresponding signal may be achieved, for example, by employing a current-to-voltage converter, which provides a voltage signal reflecting the amplitude of the current through the MOSFET.

Optionally the circuit may comprise means for sensing the voltage $U_b$ of the coupled power supply in order to additionally take the sensed voltage value into account when determining the criterion for switching the MOSFET off.

Figure 7:
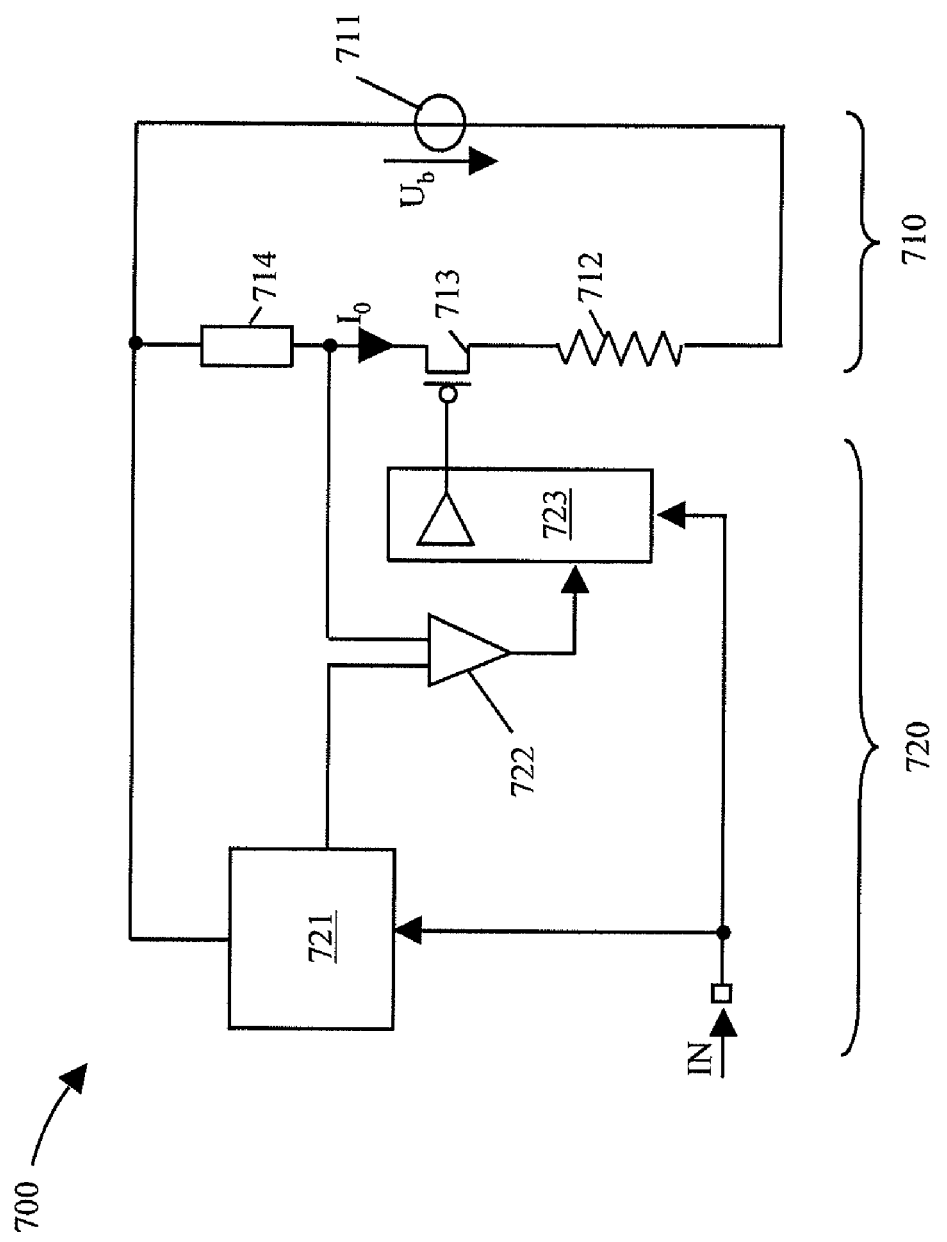
FIG. 7 depicts a schematic circuit for protecting a transistor.

FIG. 7 illustrates a corresponding schematic circuit 700 comprising a load section 710 and a control section 720 for controlling the MOSFET to protect.

Load section 710 comprises voltage source 711 and complex load 712, wherein the load in this case is considered to be an inductor as mentioned above. The load section furthermore comprises MOSFET 713, which is the MOSFET to protect, and an ohmic resistor 714 as a simple current-to-voltage converter. Voltage source 711, for example, can be a battery in a car and load 712 may be an inductor, for example, in any electric motor or a front light of the car. MOSFET 713 and resistor 714 may be part of an electronic control unit comprised in the car. MOSFET 713 may be a P-MOSFET or a N-MOSFET.

Note that in this circuit any ohmic resistors or capacitors, which may result, for example, from wiring and are thus present in real circuits, are omitted. Omitting ohmic resistors or capacitors as depicted causes most stress on the MOSFET when switching the transistor off. For example, an ohmic resistor in series to the inductor would slow down the discharge process of inductor 712 and accordingly would relieve the stress on the MOSFET. Similarly a capacitor switched in parallel or in series to the inductor would bring relieve to the circuit.

Control section 720 comprises a timer sub-circuit 721, a comparator sub-circuit 722 and a logic sub-circuit 723. Timer 721 is coupled to voltage source 711 as a reference potential, which may be, for example, ground level, and provides the reference signal to comparator circuit 722. The reference signal reflects the allowable maximum of load current $I_0$ Comparator sub-circuit 722 compares the reference signal to a signal reflecting load current $I_0$ The signal reflecting load current $I_0$, for example, can be a voltage across resistor 714 being proportional to the load current. The output of comparator 722 is fed into logic sub-circuit 723, which comprises a driver for controlling MOSFET 713.

For switching on load section 710, i.e., for coupling source 711 to load 712, a control signal IN is applied to logic circuit 723 and to timer circuit 721. Logic circuit 723 accordingly controls the comprised driver circuit to provide a control signal to MOSFET 713 for switching to on, i.e., conducting, such that a load current flows in the load section 710. At the same time, i.e., when signal IN triggers to switch MOSFET 713 into its conducting state, signal IN starts timer sub-circuit 721, which accordingly outputs the reference signal reflecting the maximum allowed load current $I_0$ in load section 710. When comparator 722 detects that the load current amplitude exceeds the allowed maximum its output signal triggers logic sub-circuit 723 to switch MOSFET 713 to non-conducting, i.e., off.

The sub-circuits comprised in circuit 700, for example, may be realized by digital sub-circuits, wherein the current amplitude and also the time may be forwarded in a digital number representation to a circuit processing these values and comparing the measured value to a calculated maximum current value and outputting a signal for controlling the MOSFET. All sub-circuits may be implemented in a single integrated circuit or in a plurality of integrated circuits, which accordingly comprise a transistor to protect, means for producing a measurement signal reflecting the current through the transistor, means for providing a reference signal decreasing with time, means for comparing the measurement signal to the reference signal and means for switching the transistor to its non-conducting state in case the measurement signal exceeds the reference signal.

In another embodiment the circuit may comprise conventional, analogue sub-circuits for providing the functionality.

Figure 8:
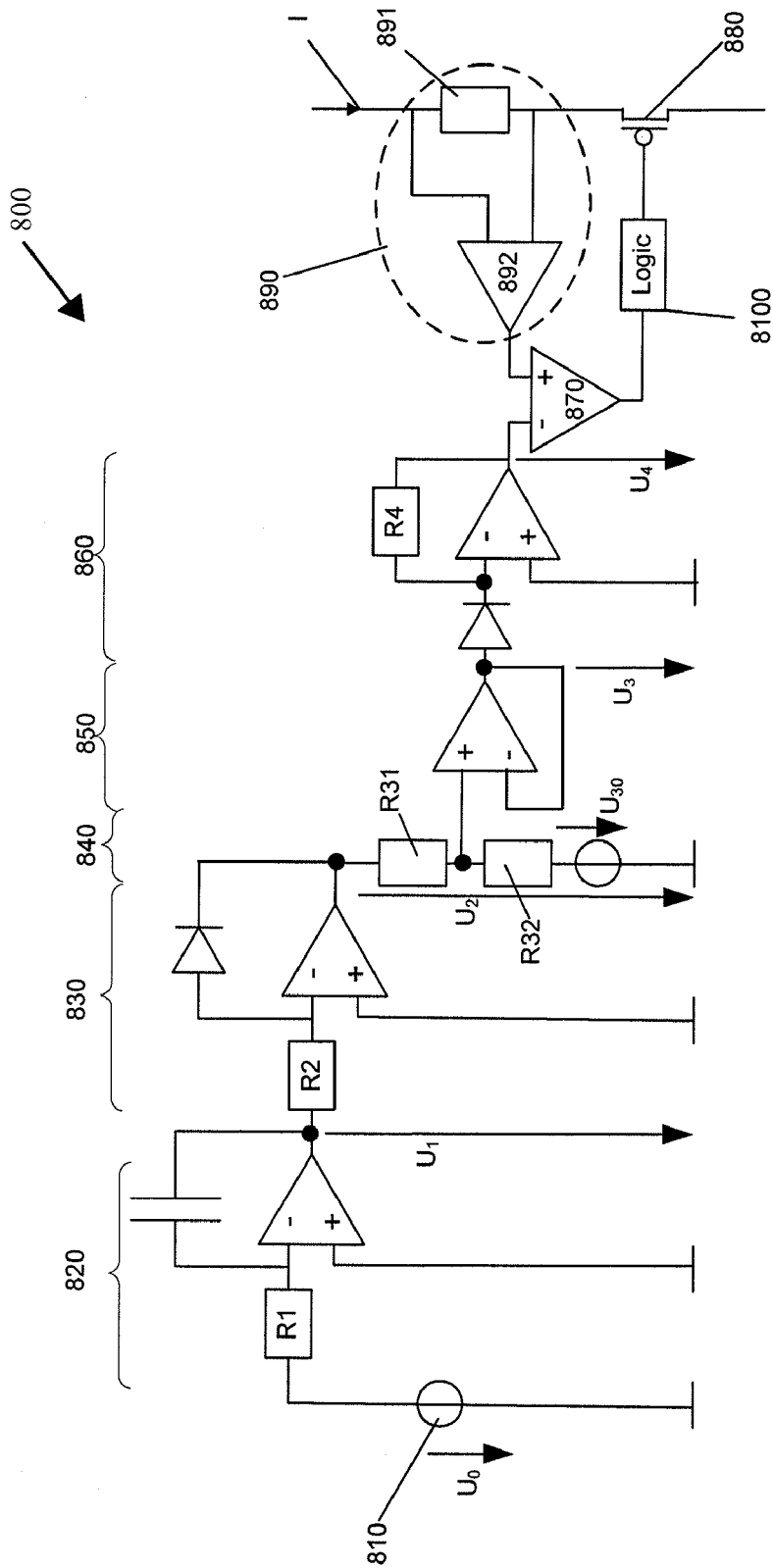
FIG. 8 depicts a schematic comprising sub-circuits for protecting a transistor.

FIG. 8 depicts a circuit 800 comprising sub-circuits providing the necessary functionality. Circuit 800 comprises a voltage source 810 providing a constant voltage of $U_0$=const, which is coupled to an integrator 820 outputting a monotonic, rising signal of, $$U_1(t) = U_{10} - U_0 \cdot \frac{t}{R_1 \cdot C}, \text{ with } U_{10} = U_1(t=0).$$

Signal $U_1$ in turn is fed into logarithmic stage 830 outputting the logarithm of its input. Accordingly the output signal of 830 can be determined to, $$U_2 = -U_T \cdot \ln \frac{U_1}{R_2 \cdot I_S} = -U_T \cdot \ln \frac{U_{10} - \frac{U_0}{R_1 C} \cdot t}{R_2 \cdot I_S},$$

with $I_s$ being the saturation current of the diode, and wherein the diode due to $U_1$>0 is conducting and accordingly $U_2$<0.

Attenuator 840, which takes the logarithmic function as input allows to tune the exponent of the function to a desired value. The output of attenuator 840 is fed into impedance converter 850, whose output signal $U_3$ can be determined to, $$U_3 = U_{30} + \frac{R_{32}}{R_{31} + R_{32}}(U_2 - U_{30})$$
$$= V \cdot U_2 + (1 - V) \cdot U_{30}$$
$$= (1 - V)U_{30} - V \cdot U_T \cdot \ln \frac{U_{10} - \frac{U_0}{R_1 C} \cdot t}{R_2 \cdot I_S},$$

wherein $V = \frac{R_{32}}{R_{31} + R_{32}}$.

From converter 850, stage 860 takes signal $U_3$ as input, from which it calculates the exponential function, which in turn is coupled to comparator 870. Signal $U_4$ can be determined as $$U_4 = -R_4 \cdot I_S \cdot e^{\frac{U_3}{U_T}}$$

$$= -R_4 \cdot I_S \cdot e^{(1-V)U_{30}} \cdot e^{\left(-V\frac{U_T}{U_T}\right)\ln \frac{U_{10} - \frac{U_0}{R_1 C} \cdot t}{R_2 I_S}}$$

$$= -R_4 \cdot I_S \cdot e^{(1-V)\frac{U_{30}}{U_T}} \cdot \left(\frac{U_{10} - \frac{U_0}{R_1 C} \cdot t}{R_2 I_S}\right)^{-V},$$

wherein due to the conducting diode $U_3$>0 and furthermore $U_4$<0. By comparing coefficients we find $U_{10}$=0 with typically 0>V>1.

Sub-circuits 810 to 860 in this way provide a reference signal $U_4$ to comparator 870.

An equivalent of current I through MOSFET 880 is provided by sub-circuit 890, which is a simple current-to-voltage converter comprising ohmic resistor 891 and amplifier 892. Sub-circuit 890 provides an output signal reflecting the load current through MOSFET 880. Accordingly comparator 870 outputs a signal indicating whether the value of current I through MOSFET 880 exceeds the reference signal provided by the chain of sub-circuits 810 to 860. The output signal of comparator 870 controls the gate voltage of MOSFET 880 via logic block 8100 providing a signal to the gate of MOSFET 880 for switching the MOSFET to its off state accordingly.

Figure 9:
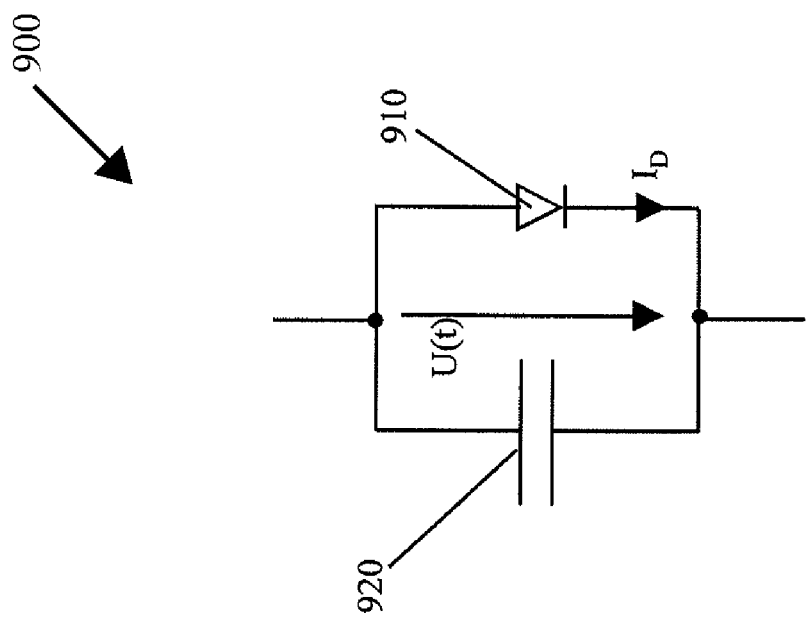
FIG. 9 depicts a sub-circuit providing a reference signal.

In another embodiment the timer circuit comprises a capacitor connected in parallel to at least one diode as a circuit providing a reference signal. FIG. 9 schematically depicts a corresponding basic circuit 900 of a timer element comprising a capacitor 910 connected parallel to at least one diode 920.

Considering that current $I_D$ through diode 910 is given as, $$I_D = I_S \left(e^{\frac{U(t)}{U_T}} - 1\right),$$

which we approximate by $$I_D = I_S \cdot e^{\frac{U(t)}{U_T}} \quad (13)$$

wherein
$I_s$ is the saturation current of the diode,
U(t) is the voltage across the diode, and
$U_T$ is the temperature voltage $$U_T = \frac{kT}{q} \approx 25.8 \text{ mV}$$

at a
temperature of T=300K, i.e., room temperature,
and the current through capacitor 920 is given as, $$I_C = I_D = C \cdot \frac{dU_C}{dt} \quad (14)$$

wherein C is the capacitance of capacitor 920,
$U_C$ is the voltage across the capacitor,
then, as the discharge current $I_C$ of capacitor 920 is the current $I_D$ through diode 910, we get, $$0 = \frac{C}{I_S} \cdot \frac{dU_C}{dt} + e^{\frac{U(t)}{U_T}}. \quad (15)$$

For solving this differential equation and in order to find voltage U(t) in equation (15), we assume a logarithmic voltage drop over time starting from an initial voltage at t=0 and reaching a zero voltage at t=τ, i.e., $$U = a \cdot \ln\frac{t}{\tau}. \quad (16)$$

From $$\frac{dU}{dt} = \frac{a}{t}$$

we find $$\frac{\tau}{t} = \frac{a}{t}. \quad (17)$$

By replacing the terms $$\frac{dU}{dt}$$

an U in equation (13) with the equivalents of equations (15) and (16) we find, $$\frac{C}{I_S} \cdot \frac{a}{t} = -e^{\frac{a \cdot \ln t/\tau}{U_T}} = -\left(\frac{t}{\tau}\right)^{\frac{a}{U_T}}. \quad (18)$$

By comparing the coefficients, i.e., by comparing $$-1 = \frac{a}{U_T} \Leftrightarrow a = -U_T,$$

we find $$\tau = \frac{C}{I_S} U_T. \quad (19)$$

And lastly, by replacing τ in equation (16) with (19), the voltage drop U across one diode parallel to a capacitor can be determined to, $$U(t) = -U_T \cdot \ln\frac{t \cdot I_S}{C \cdot U_T}. \quad (20)$$

The temporal voltage drop across a series of a number $n_C$ diodes parallel to a capacitor in a discharge process accordingly is, $$U(t) = -n_C \cdot U_T \cdot \ln\frac{t \cdot I_S}{C \cdot U_T}. \quad (21)$$

Note that the diodes comprised in the disclosed embodiments may be replaced/implemented by bipolar transistors, which provide for more exact characteristics than diodes. For this purpose the collectors of the bipolar transistors may be connected to a high voltage or to the base voltage, such that the transistors have diode characteristics.

Furthermore, as saturation current $I_S$ and temperature voltage $U_T$ are temperature dependent, additional elements may be added to the circuits in order to compensate for temperature variations.

Figure 10:
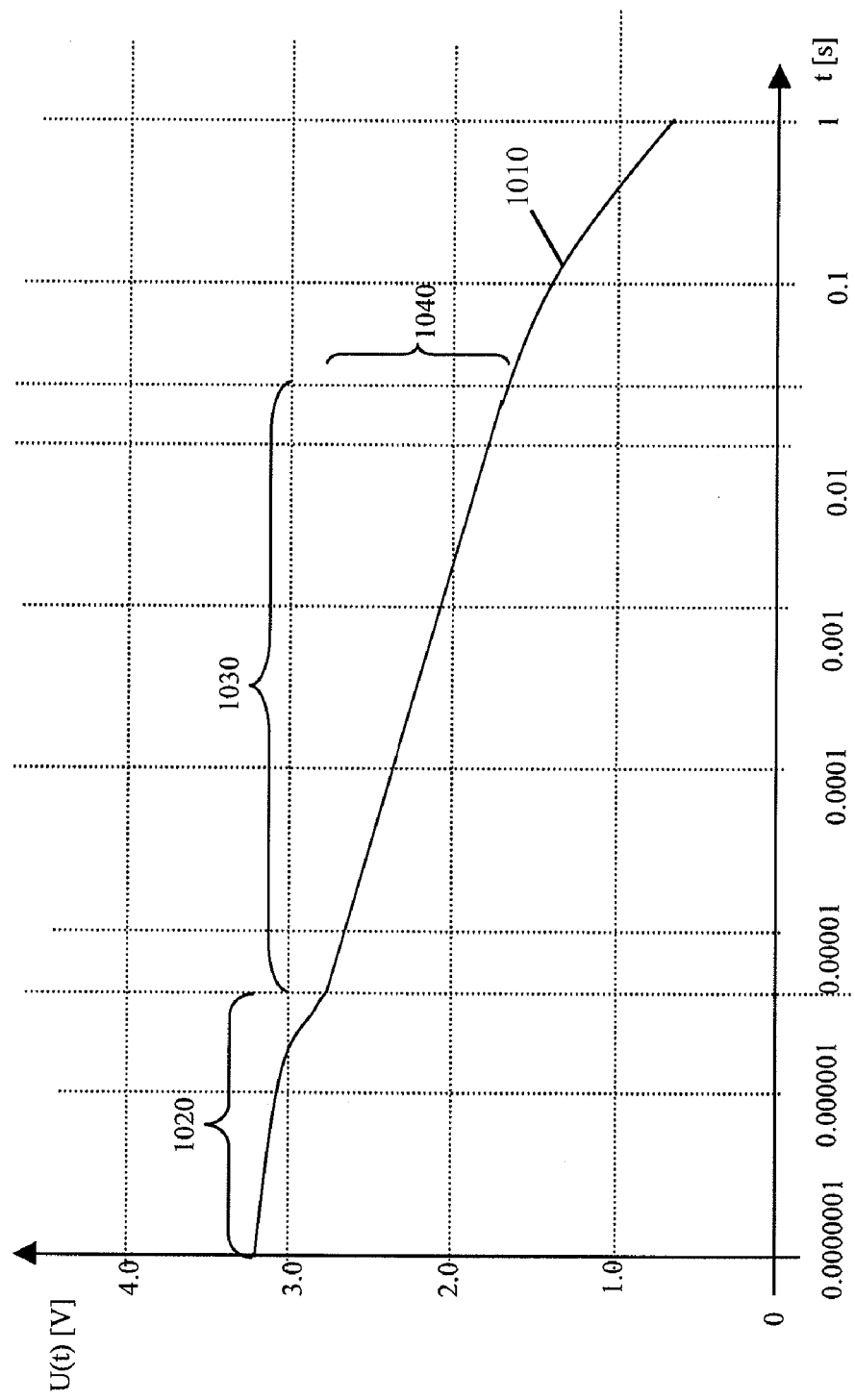
FIG. 10 depicts the temporal developing of a reference signal.

In FIG. 10 voltage 1010 illustrates the temporal development of a voltage across a series of five diodes switched in parallel to a capacitor, when the capacitor discharges. Note that on the x-axis time is logarithmic while on the y-axis voltage is linearly plotted. Initially, i.e., at the origin of the co-ordinate plane, the capacitor was charged to an initial voltage of roughly 3.2V. When the capacitor is decoupled from the charging source, i.e., the capacitor is shorted via diode 820, the load charged onto the capacitor discharges, i.e., a discharge current $I_C = I_D$ will flow through the diode, and the voltage U(t) will drop accordingly.

In the discharge process the voltage U(t) in a first time interval 1020 from t=$T_0$ to t=$T_1$ settles from the initial voltage to a level of around 2.8V and then enters a logarithmic curve lasting from t=$T_1$ to t=$T_2$. That is during time interval 1030 the voltage drops by a range 1040 of 1.2V logarithmically. Due to the logarithmic decrease this voltage may serve as a suitable reference signal.

Figure 11:
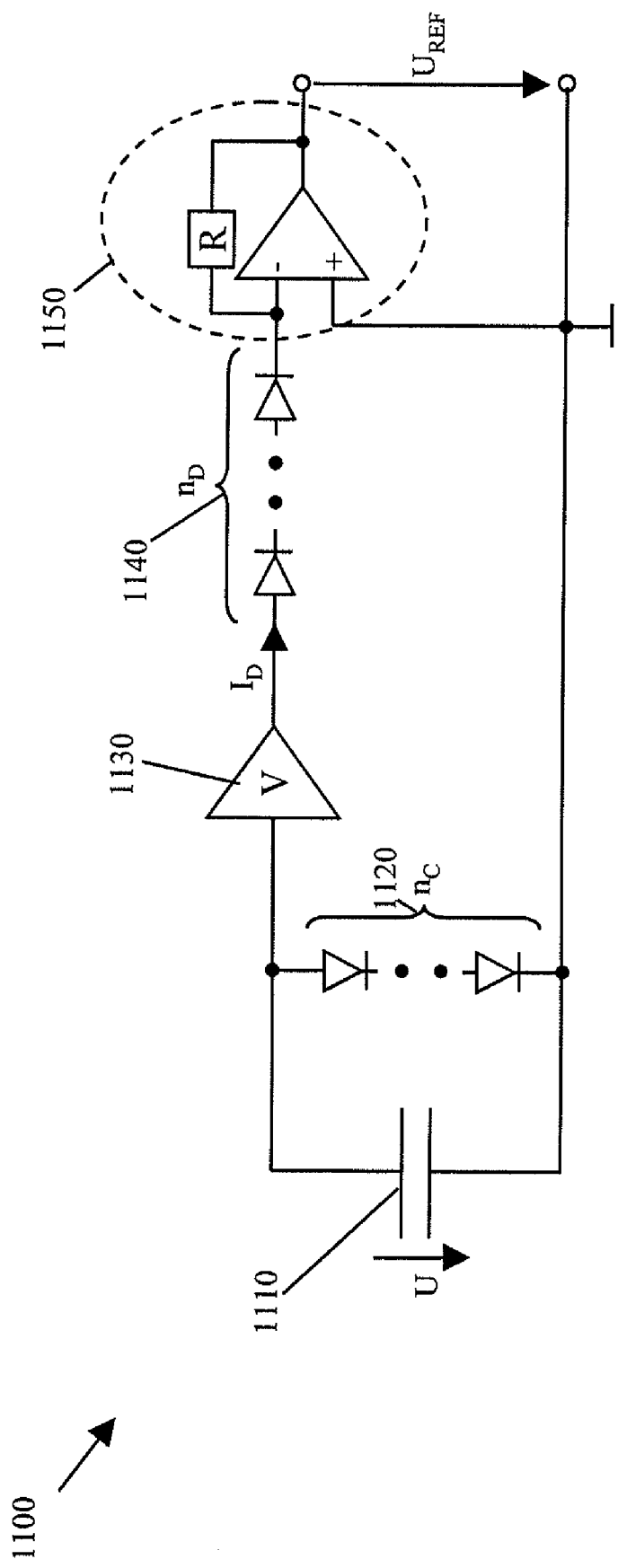
FIG. 11 depicts a circuit providing a reference signal.

FIG. 11 depicts a schematic circuit 1100 for providing a reference signal $U_{REF}$, wherein the circuit comprises a capacitor 1110 of capacitance C connected in parallel to at least one diode 1120, e.g., a series of $n_C$ diodes in this case. The voltage across the $n_C$ diodes 1120, i.e., voltage U, is coupled to amplifier 1130 having a gain of V, and which outputs a voltage of U·V. The output of amplifier 1130 is fed into a series of $n_D$ diodes 1140, such that a current $I_D$ flows through the series of $n_D$ diodes, wherein 0<$n_D$≦1. The current $I_D$ is fed into a current-to-voltage converter 1150, i.e., a transimpedance amplifier, comprising operational amplifier having ohmic resistor in its feedback path. Current-to-voltage converter 1150 outputs reference signal $U_{REF}$.

Starting from:

$$I = I_S \left(e^{\frac{U \cdot V}{n_D \cdot U_T}} - 1\right) \approx I_S \cdot e^{\frac{U \cdot V}{n_D \cdot U_T}},$$

wherein $I_S$, $U_T$, V and $n_D$ are as defined above, the reference voltage $U_{REF}$ can be determined to, $$U_{REF} = -R \cdot I \cdot \left(\frac{t \cdot I_S}{C \cdot U_T}\right)^{-V\frac{n_C}{n_D}},$$

wherein R is the ohmic resistance of resistor 1152.

Gain V of amplifier 1130 may either be adjusted to V≧1 or 0<V<1, wherein a conventional sub-circuit can implement the gain value. Accordingly, that is by using an appropriate gain value and an appropriate ratio of $$\frac{n_C}{n_D},$$

the reference value $U_{REF}$ can be adjusted to be proportional to $U_{REF} \propto t^{-x}$, with 0<x. In particular exponent x can be adjusted to match the exponent as specified in (9) or (12). Accordingly signal $U_{REF}$ can be employed as a signal indicating the temporal dependency of the current threshold for safely switching a MOSFET off.

Operation of circuit 1100 starts with charging capacitor 1110 to a predefined voltage. Upon disconnecting capacitor 1100 from a source, not shown in the figure, the discharge process of the capacitor starts, which will affect reference voltage $U_{REF}$. $U_{REF}$ may then be used as reference signal for detecting if a current through a MOSFET exceeds a threshold value.

In one embodiment circuit 1100 may be used as timer sub-circuit 721 described above.

Figure 12:
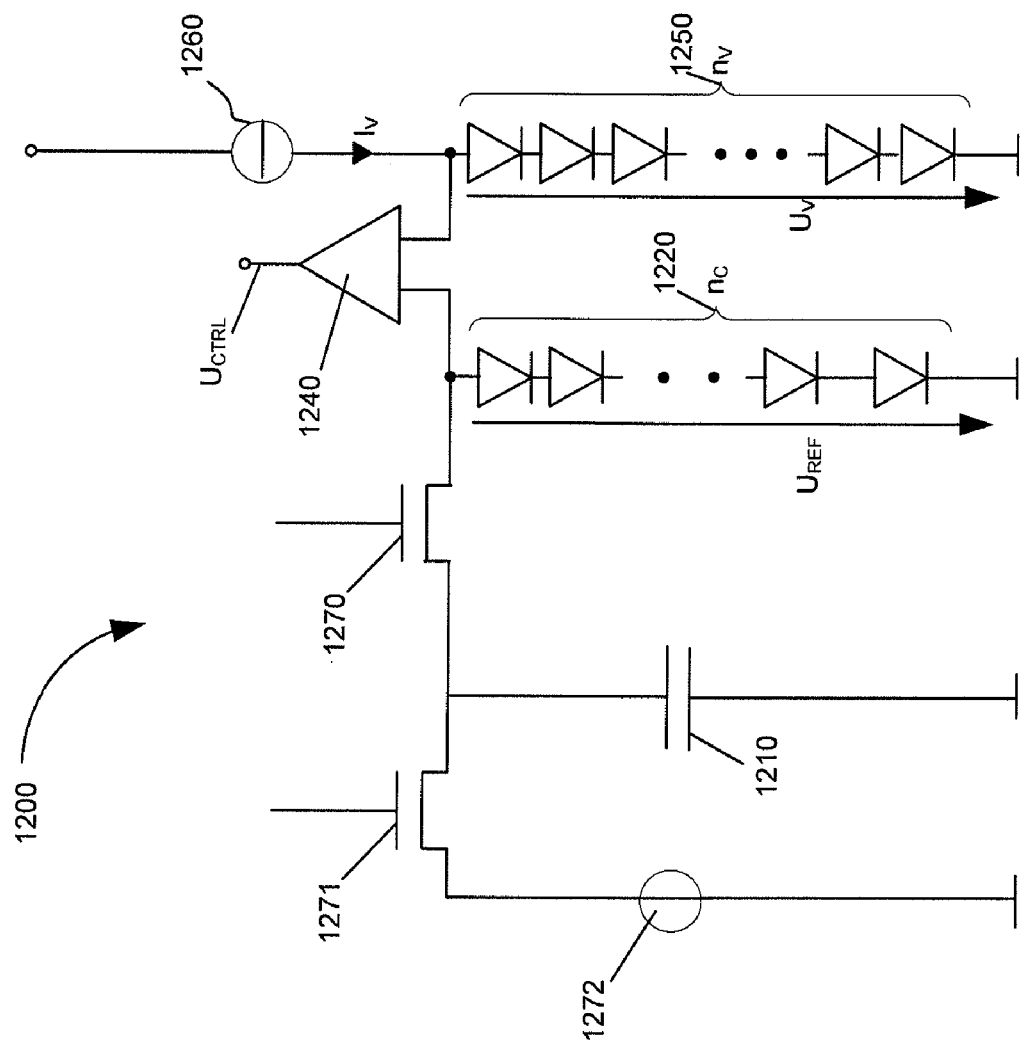
FIG. 12 depicts a circuit for protecting a transistor.

FIG. 12 depicts another embodiment comprising a capacitor connected in parallel to at least one diode. Circuit 1200 comprises a capacitor 1210 switched in parallel to at least one diode 1220, wherein in the depicted circuit a series of $n_C$ diodes is switched in parallel to the capacitor. Capacitor 1210 and diode 1220 form a sub-circuit as described with reference to FIG. 10 for providing a reference signal $U_{REF}$ to be compared to a signal representing the current through the MOSFET to protect.

The reference signal is fed into comparator 1240, which on its other input receives a signal $U_V$ representing the load current through the MOSFET to protect. Output signal $U_{CTRL}$ of comparator 1240 accordingly indicates whether the voltage amplitude of the reference signal exceeds the signal representing the load current. That is the output signal $U_{CTRL}$ of comparator 1240 toggles when the load current exceeds the limit as defined by reference signal $U_{REF}$, thus indicating that the transistor should be switched off. Output signal $U_{CTRL}$ is fed into a control or driver circuit, not shown in the drawing, controlling the MOSFET to protect.

Signal $U_V$ is produced by a current $I_V$ flowing through the series of $n_V$ diodes 1250, wherein current $I_V$ is proportional to the current actually flowing through the MOSFET to protect. That is both the reference signal $U_{REF}$ and the signal $U_V$ representing the load current through the MOSFET are produced by currents flowing through a series of diodes. Accordingly the voltages and hence the ratio of these signals can be adjusted by adjusting the number of diodes in the signal paths, i.e., $n_C$ and $n_V$ respectively. Comparator 1240 will toggle its output signal if $U_{REF}=U_V$, i.e., $$-n_C U_T \ln \frac{t \cdot I_S}{C \cdot U_T} = n_V \cdot U_T \cdot \ln\left(\frac{I_V}{I_S}+1\right) \approx n_V \cdot U_T \cdot \ln\left(\frac{I_V}{I_S}\right) \quad (22)$$

Equation (22) can be restated as $$\left(\frac{t \cdot I_S}{c \cdot U_T}\right)^{n_C} = \left(\frac{I_V}{I_S}\right)^{n_V},$$

from which we find $$I_V = I_S \cdot \left(\frac{t \cdot I_S}{C \cdot U_T}\right)^{\frac{-n_C}{n_V}}. \quad (23)$$

According to equation (23) the current limit for switching the MOSFET off can be adjusted by the ratio of the count of diodes $n_C$ and $n_V$, such that in this way the exponent in equation (12) can be adjusted. In particular the exponent of equation (12) can be achieved by using a series of 5 diodes in diode chain 1220 and 7 diodes in diode chain 1250.

Current $I_V$ flowing through diode chain 1250, for example, can be produced by a current mirror 1260 mirroring the load current through the MOSFET. Generally current mirror 1260 may be implemented by any suitable sub-circuit outputting a current $I_V$, which reflects or is proportional to the load current.

Operation of circuit 1200 begins with charging capacitor 1210 to a predefined voltage by opening switch 1270 and closing switch 1271 to couple capacitor 1210 to voltage source 1272 thus charging the capacitor to the voltage source 1272, i.e., to a predefined voltage. As switch 1270 is opened there will be no energy loss during the charge process caused by diode chain 1220.

When capacitor 1210 has been loaded it is decoupled from source 1272 by opening switch 1271 and the discharge process of the capacitor is started by closing switch 1270 thus supplying a voltage $U_{REF}$ as depicted in FIG. 10 to comparator 1240. Starting from its initial amplitude and dropping as determined by equation (21) voltage $U_{REF}$ initially will be of higher amplitude than voltage $U_V$, such that comparator 1240 will output a signal affecting the MOSFET to switch to its conducting state, which in turn affects an increasing current $I_V$ through diodes 1250. As long as $U_V$ does not exceed $U_{REF}$ the MOSFET is kept in its conducting state thus allowing a load current through the MOSFET to protect.

If current $I_V$ through diodes 1250 affects a voltage $U_V$ exceeding the reference voltage $U_{REF}$, then comparator 1240 will toggle its output signal $U_{CTRL}$, which in turn will trigger the control circuit to switch the MOSFET off. That is, as current $I_V$ reflects the load current through the MOSFET, the MOSFET is switched off in case the actual load current exceeds the limit as determined by voltage $U_{REF}$.

Note that in one embodiment $U_{REF}$ may fall monotonic, such that at some time $U_V$ inevitably exceeds $U_{REF}$, thus switching off the MOSFET. This switching off can be prevented by introducing a limit as described with reference to FIG. 6, below which the control circuit does not switch off the MOSFET.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. In particular sub-circuits having functions described above may be implemented by different conventional topologies.

What is claimed is:

1. A method for operating an integrated circuit comprising a transistor, the method comprising switching the transistor to its non-conducting state when a current through the transistor exceeds a threshold value, the threshold value being proportional to a function of $t^{-x}$, with t being the time since switching the transistor to its conducting state and with x>0.

2. The method of claim 1, wherein $0<x\leq 1$.

3. The method of claim 1, wherein $0.5\leq x\leq 0.75$.

4. The method of claim 1, wherein the threshold value does not fall below a predefined minimum.

5. The method of claim 1, wherein the transistor is a power MOSFET.

6. An integrated circuit comprising a transistor, wherein the integrated circuit is configured and adapted to switch the transistor to its non-conducting state when a current through the transistor exceeds a threshold value, the threshold value being proportional to a function of $t^{-x}$, with t being the time since switching the transistor to its conducting state and with $x>0$.

7. The integrated circuit of claim 6, wherein $0<x\leq 1$.

8. The integrated circuit of claim 6, wherein $0.5\leq x\leq 0.75$.

9. The integrated circuit of claim 6, wherein the threshold value does not fall below a predefined minimum.

10. The integrated circuit of claim 6, wherein the transistor is a power MOSFET.

11. An integrated circuit comprising a transistor, the integrated circuit comprising:
    means for providing a signal reflecting a current through the transistor,
    means for providing a reference signal proportional to a function of $t^{-x}$, with t being the time since switching the transistor to its conducting state and with $x>0$,
    means for comparing the signal reflecting the current through the transistor with the reference signal, and
    means for switching the transistor to its non-conducting state when the signal reflecting the current through the transistor exceeds the reference signal.

12. The integrated circuit of claim 11, wherein the means for providing the reference signal comprises:
    a voltage node carrying a constant voltage;
    an integrator stage taking the constant voltage as input;
    a logarithmic stage coupled to an output of the integrator stage;
    an attenuator stage coupled to an output of the logarithmic stage; and
    an exponential stage coupled to an output of the attenuator stage and outputting the reference signal.

13. The integrated circuit of claim 12, furthermore comprising an impedance converter coupled between the attenuator stage and the exponential stage.

14. The integrated circuit of claim 12, furthermore comprising a voltage source coupled to the attenuator stage for adding a constant voltage to the output of the attenuator stage.

15. The integrated circuit of claim 11, wherein the means for providing the reference signal comprises a capacitor connected in parallel to at least one diode.

16. The integrated circuit of claim 15, wherein the at least one diode is implemented by a bipolar transistor.

17. The integrated circuit of claim 15, wherein the means for providing a reference signal comprises:
    an amplifier taking a voltage across the at least one diode as input;
    at least one diode coupled to an output of the amplifier; and
    a current-to-voltage converter coupled to said the at least one diode and outputting the reference signal.

18. The integrated circuit of claim 17, wherein at least one bipolar transistor implements the at least one diode.

19. An integrated circuit comprising a MOSFET and a sub-circuit for controlling the MOSFET, wherein the sub-circuit comprises:
    a capacitor connected in parallel to a series of $n_C$ diodes, with $n_C$ being an integer and $n_C \geq 1$,
    a source for providing a current proportional to a current flowing through the MOSFET,
    a series of $n_D$ diodes, into which the current proportional to the current through the MOSFET is fed, with $n_D$ being integer and $n_D \geq 1$, and
    a comparator comparing the voltages across the series of $n_C$ diodes and across the series of $n_D$ diodes.

20. The integrated circuit of claim 19, wherein bipolar transistors implement the $n_C$ and $n_D$ diodes.

21. The integrated circuit of claim 19, wherein $n_C=5$ and $n_D=7$.

22. The integrated circuit of claim 19, wherein the means for providing a current proportional to a current flowing through the MOSFET comprises a current mirror.

* * * * *